US008014211B2

(12) United States Patent
Hess et al.

(10) Patent No.: US 8,014,211 B2
(45) Date of Patent: Sep. 6, 2011

(54) KEEPERLESS FULLY COMPLEMENTARY STATIC SELECTION CIRCUIT

(75) Inventors: Greg M. Hess, Mountain View, CA (US); Honkai Tam, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 143 days.

(21) Appl. No.: 12/480,552

(22) Filed: Jun. 8, 2009

(65) Prior Publication Data

US 2010/0309731 A1 Dec. 9, 2010

(51) Int. Cl.
*G11C 7/00* (2006.01)
(52) U.S. Cl. ......... 365/189.02; 365/185.22; 365/185.25; 365/185.28; 365/230.03; 365/230.06
(58) Field of Classification Search ............. 365/189.02, 365/185.22, 230.03, 185.25, 185.28, 230.06
See application file for complete search history.

(56) References Cited

U.S. PATENT DOCUMENTS

| | | | | |
|---|---|---|---|---|
| 6,629,194 | B2 * | 9/2003 | Kumar et al. | 711/104 |
| 6,707,700 | B2 * | 3/2004 | Kang | 365/145 |
| 7,092,279 | B1 | 8/2006 | Sheppard | |
| 7,239,565 | B2 * | 7/2007 | Liu | 365/203 |
| 7,454,593 | B2 | 11/2008 | Kirsch | |
| 7,627,737 | B2 | 12/2009 | Kirsch | |
| 7,684,240 | B2 * | 3/2010 | Cho | 365/185.05 |
| 7,719,909 | B2 * | 5/2010 | Chung et al. | 365/205 |

* cited by examiner

*Primary Examiner* — Connie C Yoha
(74) *Attorney, Agent, or Firm* — Lawrence J. Merkel; Meyertons, Hood, Kivlin, Kowert & Goetzel, P.C.

(57) ABSTRACT

Selection circuitry for use in register files, multiplexers, and so forth is disclosed. The selection circuitry includes a plurality of local bit lines coupled to global bit line circuitry. Groups of cells or data inputs are coupled to each of the local bit lines. When a cell or data input of a given group is selected, a group select signal is provided to the global bit line circuitry. The global bit line circuitry drives a global bit line responsive to the group select signal and the data driven on (or provided to) the local bit line associated with the selected cell/input, thus providing a data output. When no cell of a given group is selected, the group select signal is de-asserted, causing the respective global bit line to be held in a predetermined state.

25 Claims, 9 Drawing Sheets

KEEPERLESS FULLY COMPLEMENTARY STATIC SELECTION CIRCUIT

BACKGROUND

1. Field of the Invention

This invention relates to electronic circuits, and more particularly, to circuits for conveying selected ones of a number of different logic values.

2. Description of the Related Art

Selection circuitry is utilized in a wide variety of logic circuits in order to select one of a number of different logic values. One type of selection circuit is known as a multiplexer. A multiplexer may include a number of data inputs and a number of selection inputs. Based on a particular combination of selection inputs, a given one of the data inputs may be selected and provided as an output from the multiplexer. Various types of multiplexers configured to output a single bit of data may include a number of transistors arranged to form various logic gates, one of which may be used to output the selected data bit. Multi-bit multiplexers configured to select and output data sets made up of a number of bits (e.g., 8 bits) are also possible.

Selection circuits may also be used in memory applications to select memory cells in order to accomplish read operations. Within a given memory, selection circuits that are each coupled to a number of different cells of the memory may be coupled to various local bit lines. For a read operation, the bit lines may be precharged high. A decoder in the memory may receive address signals indicative of a memory address from which data is to be read. The decoder may generate word line signals based on the received address signals. These word line signals may be received by the selection circuitry within the memory, and may select the cell of the memory from which data is to be read. The selected cell may selectively discharge to the local bit line based on its stored value. If it is not discharged, a keeper circuit may hold the bit line high but may also impede the discharged of the selected cell by supplying current to resist the discharge.

SUMMARY

A selection circuit is disclosed. In various embodiments, the selection circuit may be used in a memory (e.g., in a register file) in order to convey bits from selected cells to global bit lines coupled to a read port during read operations. In other embodiments, the selection circuit may be utilized as a multiplexer for selecting a data input and conveying data therefrom to a global bit line that provides an output for the multiplexer.

In one embodiment, a register file includes cells arranged in non-overlapping groups and coupled to corresponding local bit lines. One cell of a group coupled to a given local bit line may be selected at a given time. When selected, the given cell may drive its respective local bit line. Other local bit lines may be held in a predetermined state and thus may not be driven by any of the cells coupled thereto. Global bit line generation circuitry may be coupled to the local bit line. When the given cell is selected (via the assertion of a signal on a word line), the corresponding assertion of an associated group select line may allow the state of the local bit line to be driven onto the global bit line via the global bit line generation circuitry. When none of the cells of a group of cells coupled to a local bit line are selected, the corresponding local bit line may be held in a predetermined state responsive to the respective group select signal being de-asserted. The arrangement may enable the implementation of a memory that does not require keepers coupled to the local bit lines, in one embodiment. Furthermore, the ability of memory cells to directly drive their respective local bit lines may enable the memory to be implemented without requiring precharging prior to read operations in one embodiment.

BRIEF DESCRIPTION OF THE DRAWINGS

Other aspects of the disclosure will become apparent upon reading the following detailed description and upon reference to the accompanying drawings in which.

Figure 1:
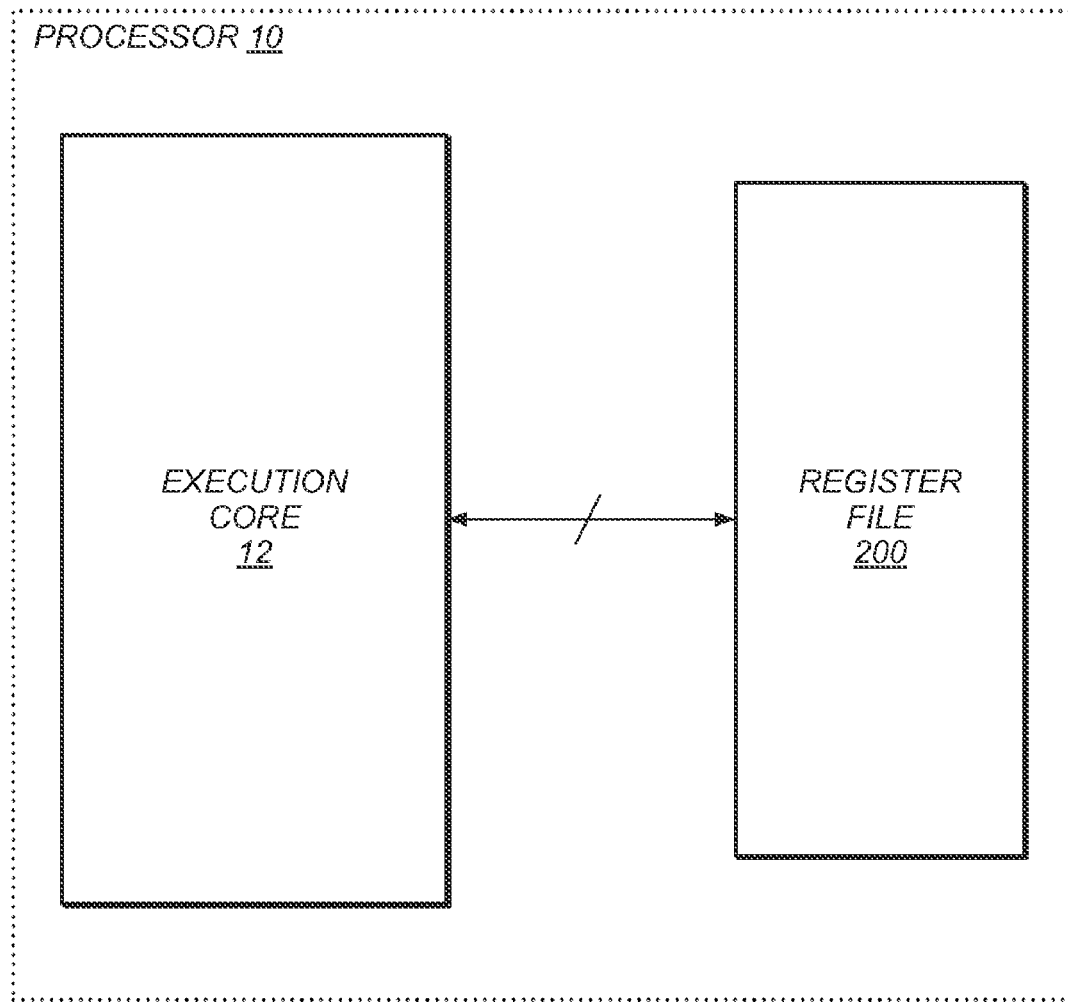
FIG. 1 is a block diagram of one embodiment of a processor.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

Turning now to FIG. 1, a block diagram of one embodiment of a processor is shown. In the embodiment shown, processor 10 includes an execution core 12 coupled to a register file 200.

Various signals may be conveyed between execution core 12 and register file 200, including address signals, data signals, enable signals, and so forth. Embodiments of processor 10 including additional execution cores 12 and/or additional register files 200 are possible and contemplated.

Processor 10 may be configured to execute instructions defined in an instruction set architecture (ISA) that is implemented by the processors. Generally, the ISA may specify the instructions, their operation, their coding, etc. Thus, a programmer or compiler may provide instructions as specified in the ISA, and processor 10 may execute the instructions and produce the specified operation as a result.

Execution core 12 may be configured to execute the instructions in the ISA. Thus, execution core 12 may include circuitry to fetch, decode, execute, and commit the result of each instruction. Execution core 12 may implement any microarchitecture, including superscalar and/or superpipelined microarchitectures, in-order execution or out-of-order execution; speculative execution, single threaded or multithreaded execution, etc. In various embodiments, execution core 12 may implement microcoding techniques in addition to any of the above implementations.

In the embodiment shown, register file 200 is configured to store information to support operation of execution core 12. Information stored by register file 200 may include operands for use in the execution of instructions, results from the execution of instructions, and any other type of information usable by the execution core 12. In some embodiments, register file 200 may include a number of general-purpose registers. Other embodiments of register file 200 may include a number of special-purpose registers, each designated to store information (e.g., a flags register which stores flags that may be used by execution core 12 during the execution of instructions). Embodiments including both special-purpose and general-purpose registers are possible and contemplated. Some embodiments of register file 200 may include multiple copies of various registers in order to support techniques such as speculative execution, out-of-order execution, and so forth. Each register of register file 200 may include a number of bit cells, each of which of is configured to store a bit of information. As will be discussed in further detail below, data stored in a given bit cell may be used to drive to a global bit line through various embodiments of a selection circuit to output data for a read operation.

Generally, the execution core 12 may read data from registers in register file 200 and may also write data to registers in register file 200. Register file 200 may include one or more read ports to support read operations and one or more write ports to support write operations. Each read port may receive a register address and one or more control signals indicating a read, and may output data to supply read data to execution core 12. Each write port may receive a write address, one or more control signals indicating a write, and a data input to receive write data.

Figure 2:
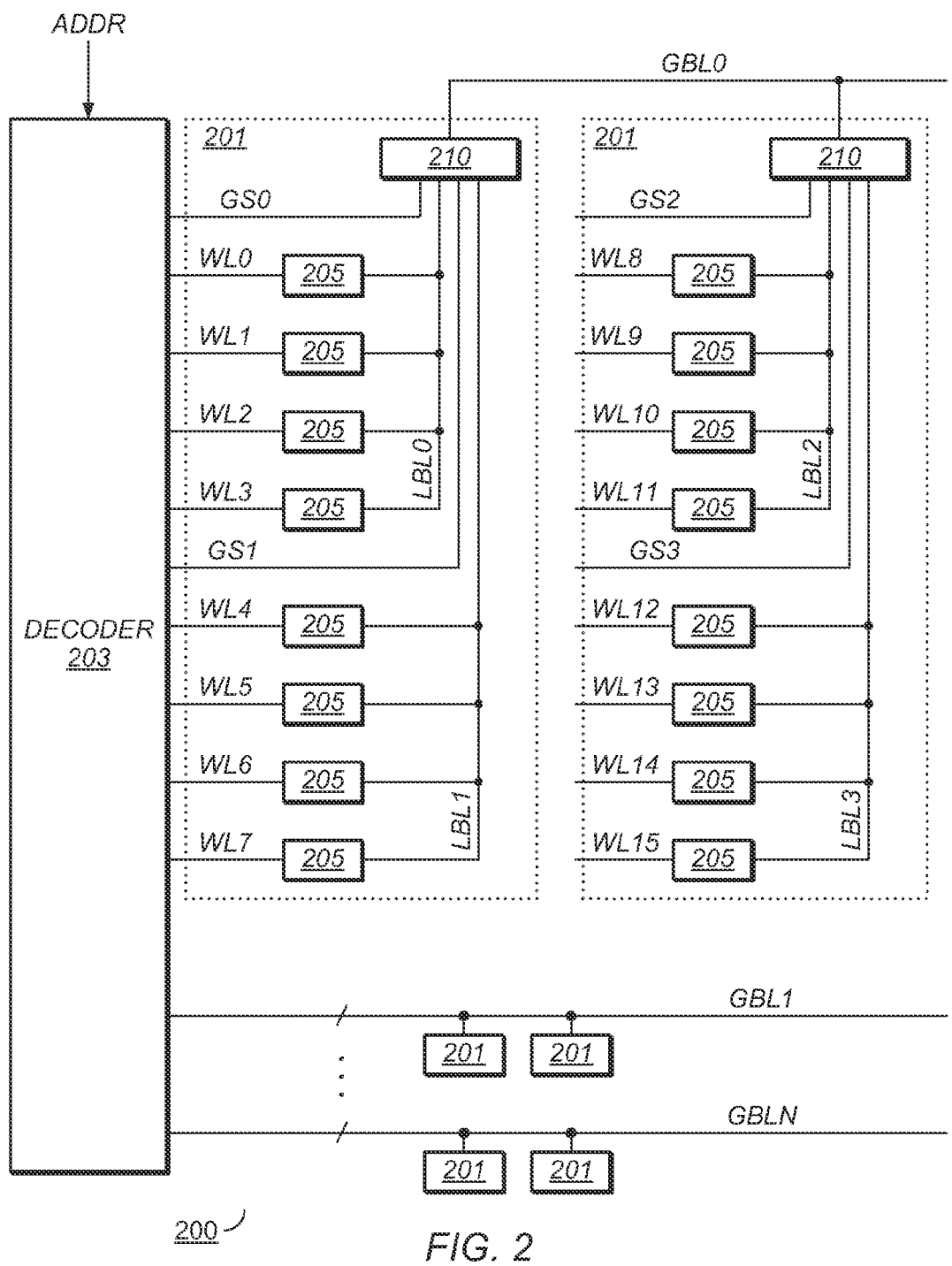
FIG. 2 is a block diagram of one embodiment of a register file.

FIG. 2 is a block diagram of one embodiment of a register file. In the embodiment shown, register file 200 includes a decoder 203 and a plurality of selection circuits 201. Each of the selection circuits 201 in the embodiment shown is coupled to a global bit line (e.g., GBL0, GBL1, GBLN) that may be used to provide data for a read port of register file 200. Furthermore, each selection circuit 201 may include one or more global bit line generation circuits 210, each coupled to a global bit line, as will be discussed below. In the embodiment shown, global bit line generation circuits 210 are coupled to corresponding global bit lines in a wired-OR configuration. Register file 200 may include a total of N global bit lines, wherein N may be any suitable value (e.g., 7, 15, 31, etc.) for the particular implementation. That is, N+1 may be the width of a register in register file 200. It is noted that circuitry similar to that shown in FIG. 2 may be repeated for each read port of the register file 200.

Each selection circuit 201 in the embodiment shown includes multiple cell units 205, each of which includes a bit cell configured to store a bit of data. The cell units 205 in the embodiment shown are divided into non-overlapping sets of two or more cell units each, with each set being associated with a corresponding local bit line. Each of cell units 205 in this embodiment is coupled to decoder 203 via word lines (e.g., WL0, WL1, etc.). Responsive to receiving an address (e.g., register address) from an external source, (e.g., from execution core 12 of FIG. 1), decoder 203 may decode the address and assert word line corresponding to a selected cell unit 205. For a particular global bit line, only one word line may be asserted (e.g., for GBL 0, only one of WL0-WL15 may be asserted). As shown in FIG. 2, the word lines may also be coupled in parallel to others sets of cell units 205 corresponding to global bit lines GBL0-GBLN.

It should be noted herein that the use of the term 'asserted' is not limiting to a particular logic voltage level. Thus, embodiments are possible and contemplated wherein a signal is considered to be asserted when at a logic high voltage level, as are embodiments wherein signals are considered asserted when at a logic low voltage level. Furthermore, embodiments wherein some signals are considered asserted when at a logic high voltage level while other signals are considered asserted when at a logic low voltage level are also possible and contemplated.

In addition to asserting word lines, decoder 203 may also assert one or more group select lines (e.g., GS0, GS1, etc.) responsive to decoding the received address. In the embodiment shown, each cell unit 205 is part of a group of cell units 205 coupled in a wired-OR configuration to a particular one of a number of different local bit lines. For example, a first group of cell units 205 is coupled to the LBL0 (i.e. local bit line 0), a second group of cell units is coupled to LBL1, and so on. When a decoded address results in the assertion of a particular word line, a corresponding group select line may also be asserted. For example, if any of word lines WL0-WL3 is asserted responsive to the decoding of an address, decoder 203 may also assert global select line GS0, which corresponds to that particular group. Similarly, if any of word lines WL4-WL7 is asserted responsive to an address decoded by decoder 203, GS1 may also be asserted.

In the embodiment shown, each local bit line and each group select line is coupled to a global bit line generation circuit 210, which is in turn coupled to a respective one of the global bit lines. Each global bit line may be coupled to multiple ones of global bit line generation circuits 210, and thus multiple ones of selection circuits 201. For example, GBL0 is coupled to two global bit line generation circuits 210 in the embodiment shown. Embodiments with as few as one global bit line generation circuit coupled to a global bit line and embodiments are possible and contemplated. Embodiments wherein more than two global bit line generation circuits 210 are coupled to a global bit line are also possible and contemplated. Furthermore, the number of cell units 205 per group and the total number of word lines may vary in other embodiments.

Each of the global bit line generation circuits 210 may be configured to drive its respective global bit line in accordance with a selected one of cell units 205, and more particularly, in accordance with a value stored in a bit cell of the selected one of cell units 205. In embodiments where multiple ones of selection circuits 201 are coupled to each global bit line, only one of the selection circuits 201 coupled thereto may drive a particular global bit line. Furthermore, within a selection circuit 201, at most only one of the global bit line generation circuits 210 may drive a respective global bit line. For a given global bit line generation circuit 210, only one local bit line may be active at a given time. And finally, for a given local bit line, only one word line corresponding to a cell unit 205 coupled thereto may be active at a given time. In general, each global bit line is coupled to a one-hot structure wherein the logic value stored in one cell unit 205 is driven to a corresponding global bit line at a given time.

Consider for example the embodiment shown, wherein two selection circuits 201 are coupled to GBL0. For a given address decoded by decoder 203, only one of word lines WL0-WL15 may be asserted. Similarly, only one of group select lines GS0-GS3 may be asserted, and only one of local bit lines LBL0-LBL3 may be active (i.e. may be driven to a state in accordance with a bit stored in the selected cell unit 205). Finally, for a given address decoded by decoder 203, only one of the two global bit line generation circuits 210 coupled to GBL0 may drive that particular global bit line.

In another example, if word line WL1 is asserted responsive to a decoded address, GS0 may also be asserted, LBL0 may become active, and the corresponding one of global bit line generation circuits 210 may drive GBL0. Furthermore, when word line WL1 is asserted, word lines WL0 and WL2-WL15 may be de-asserted. Group select lines GS1-GS3 may also be de-asserted, while local bit lines LBL1-LBL3 may be inactive (i.e. held to a predetermined state regardless of logic values stored in the cell units 205 coupled thereto).

Figure 3:
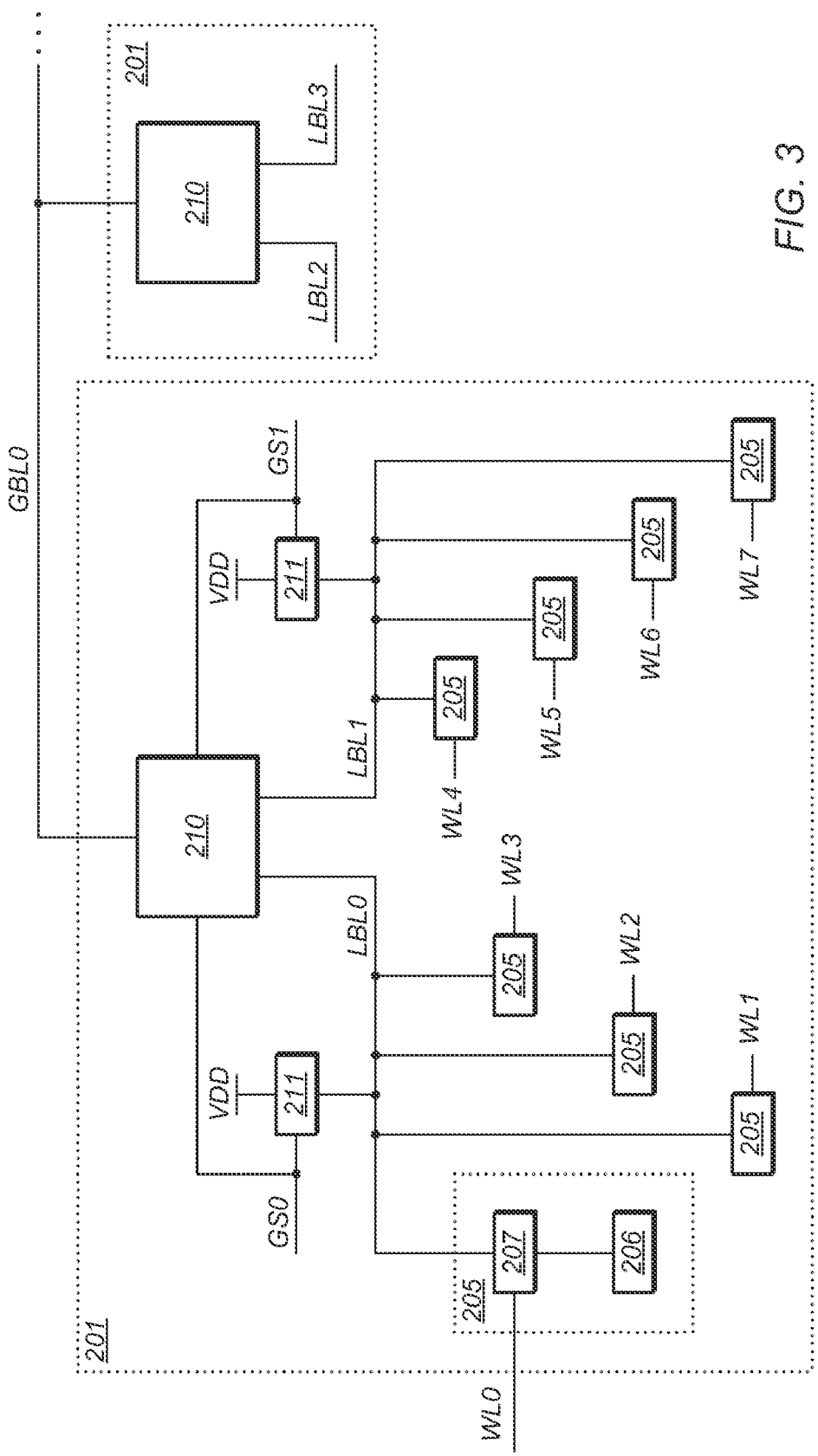
FIG. 3 is a block diagram of one embodiment of selection circuitry in a register file.

FIG. 3 is a block diagram of one embodiment of selection circuitry in a register file. In the example shown, two instances of selection circuit 201 are coupled to a global bit line, with one of instances shown in greater detail. As noted above, each selection circuit 201 may include a global bit line generation circuit 210 coupled to receive a number of local bit lines and a number of group select lines. In the detailed example of the embodiment shown in FIG. 3, global bit line generation circuit 210 is coupled to receive group select signals GS0 and GS1, along with two local bit lines, LBL0 and LBL1. Each of the local bit lines in this embodiment is coupled to four different cell units 205. Each cell unit 205 may include a bit line generation circuit 207 and a bit cell 206. A bit cell 206 may be configured to store a bit of data. A bit line generation circuit 207 may be configured to convey to its respective bit line the logic value of a bit stored in its respective bit cell 206. In this example, when word line WL0 is asserted, the corresponding bit line generation circuit 207 may become active, thereby causing local bit line LBL0 to be driven to the logic state of the bit stored in bit cell 206.

In addition to the cell units 205, the embodiment shown also includes pull-up circuits 211 coupled to each of local bit lines LBL0 and LBL1. The pull-up circuits 211 in this embodiment are each coupled to a respective one of the group select lines that also corresponds with its respective local bit line. In this embodiment, when a respective group select signal is asserted, the corresponding pull-up circuit 211 is inactive. Thus, when any one of word lines WL0-WL3 is asserted (thereby selecting a corresponding cell unit), GS0 may also be asserted and the pull-up circuit 211 coupled thereto may remain inactive. Thus, the local bit line LBL0 may be driven in accordance with the logic state stored in the selected one of cell units 205. However, if none of word lines WL0-WL3 is asserted (indicating that none of the corresponding cell units 205 is selected), the group select line GS0 may also be de-asserted, thus allowing the corresponding pull-up circuit 211 to become active. When active, a given pull-up circuit 211 may pull its corresponding local bit line toward a source voltage (VDD in this example), thereby holding that local bit line in a predetermined state. As will be discussed in further detail below, when a group select line is de-asserted and its corresponding local bit line is held in a predetermined state, a global bit line circuit 210 coupled to receive the local bit line and the group select signal may prevent that local bit line from driving a corresponding global bit line.

It should be noted that embodiments that utilize pull-down circuits (e.g., pulls a bit line toward a ground voltage when active) instead of pull-up circuits 211 are possible and contemplated. In general, pull-up circuits or pull-down circuits may be utilized to pull respective local bit lines to a predetermined state when no corresponding cell unit 205 is selected.

Figure 4:
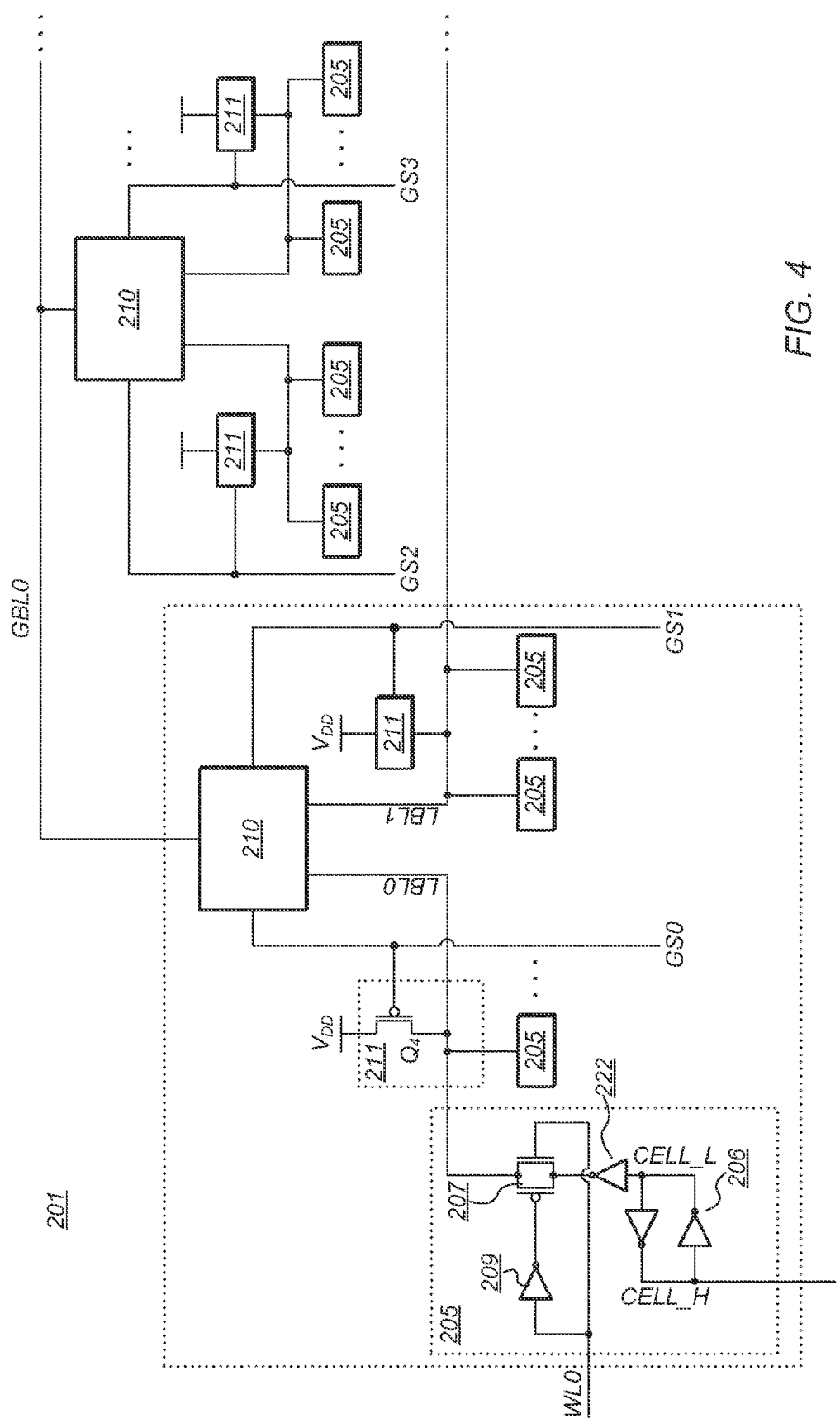
FIG. 4 is a schematic diagram of one embodiment of selection circuitry in a register file.

Turning now to FIG. 4, a schematic diagram of one embodiment of selection circuitry in a register file is shown. In the embodiment shown of selection circuit 201, each cell unit 205 includes a bit cell 206, bit line generation circuitry 207, and an inverter 209 coupled to the bit line generation circuitry 207. In this particular embodiment, a passgate is used to form the bit line generation circuitry 207. An NMOS transistor of bit line generation circuitry 207 is coupled to receive the word line, while a PMOS transistor of bit line generation circuitry 207 is coupled to receive a complement of the word line, via inverter 209. Inverter 222 in the embodiment shown is coupled between cell unit 205 and bit line generation circuitry 207. When the word line is asserted, bit line generation circuitry 207 may become active and thus transparent to the output of inverter 222, thus allowing the true logic value stored in cell unit 205 (e.g., the logic value of node CELL_H in this embodiment) to propagate to local bit line LBL0.

Bit cell 206 in the embodiment shown includes a pair of cross-coupled inverters. For this particular embodiment, one node of bit cell 206, labeled CELL_H, stores a true logic value of a stored bit, while the complementary value of the stored bit is stored on the node CELL_L. As previously noted, inverter 222 is coupled between the node CELL_L of bit cell 206 and bit line generation circuitry 207. Inverter 222 may prevent noise that may be present on from potentially corrupting the contents stored in bit cell 206 when bit line generation circuitry becomes active. In some embodiments, the complementary node CELL_L may be coupled to the bit line generation circuitry 207 without the intervening inverter 222. Furthermore, other connections to bit cell 206 that are not explicitly shown here may be present in order to enable the writing of data into the cell.

It should be noted that while certain types of circuitry are shown forming cell unit 205 in the embodiment of FIG. 4, other types of circuitry may also be used to form the same. Such circuitry may include any suitable arrangement of logic gates, transistors, and so forth, that allows for the storage of a bit of information and circuitry to allow the stored bit (or complement thereof) to be conveyed to a local bit line.

Each local bit line in the embodiment shown is coupled to a pull-up circuit 211. The functioning of pull-up circuit 211 as described herein may apply to each pull-up circuit 211 coupled to a corresponding local bit line. In the embodiment shown, each pull-up circuit 211 includes a PMOS transistor having a gate terminal coupled to a corresponding group select line. In this particular example, transistor Q4 is shown as having its gate terminal coupled to group select line GS0. When GS0 is de-asserted in this embodiment (i.e. when it is driven low), transistor Q4 may become active, thus providing a pull-up path between the local bit line LBL0. Local bit line LBL0 is thus pulled toward a source voltage VDD when group select line GS0 is de-asserted. If group select line GS0 is asserted, transistor Q4 may become inactive. The assertion of group select line GS0 may indicate the selection of one of the cell units 205 that is coupled to local bit line LBL0. Accordingly, when group select line GS0 is asserted (and thus Q4 is inactive), local bit line LBL0 may be driven to a logic state in accordance with a bit of data stored in a selected cell unit 205. Thus, in this embodiment, if word line WL0 is asserted, the passgate of bit line generation circuit 207 becomes active, while transistor Q4 of pull-up circuit 211 becomes inactive. As a result, the logic value of the true node, CELL_H, may propagate to local bit line LBL0 (via node CELL_L and inverter 222) and thus to global bit line generation circuit 210. Global bit line generation circuit 210 may in turn drive global bit line GBL0 based on the logic value received via local bit line LBL0.

Figure 5:
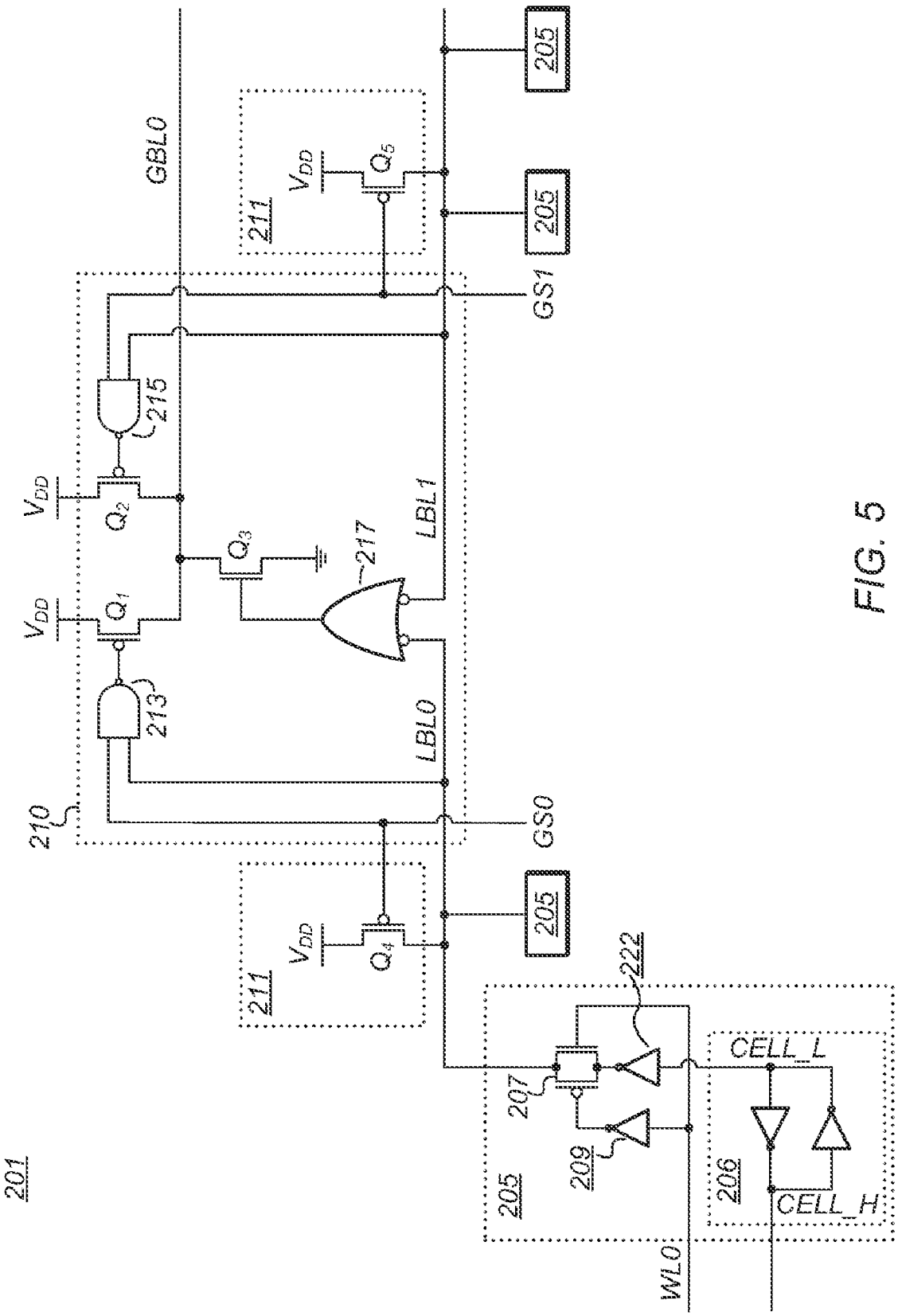
FIG. 5 is a schematic diagram of one embodiment of a global bit line generation circuit.

FIG. 5 is a schematic diagram of one embodiment of a global bit line generation circuit 210. In the embodiment shown, selection circuit 201 includes sets of cell units 205, (each cell unit 205 being coupled to a local bit line) and pull-up circuits 211, as previously described. Global bit line generation circuit 210 in the embodiment shown includes logic gates 213, 215, and 217, along with corresponding transistors Q1, Q2, and Q3. Global bit line generation circuit 210 may drive global bit line GBL0 depending on the states of various signal inputs.

In the embodiment shown, if a cell unit 205 coupled to local bit line LBL0 is selected, group select signal GS0 may be asserted. When asserted, group select line GS0 may provide a logic high voltage to both transistor Q4 of its respective pull-up circuit 211 and to an input of logic gate 213 (which is a NAND gate in this embodiment). Meanwhile, group select line GS1 may be de-asserted, since none of its corresponding cell units 205 were selected in this example. Accordingly, a logic low voltage may be provided via group select line GS1 to the corresponding input of logic gate 215 (also a NAND gate in this embodiment). The logic low voltage on the input of logic gate 215 may in turn result in a logic high voltage output from logic gate 215, which in turn may cause transistor Q2 to remain inactive. Furthermore, since group select line GS1 is de-asserted, the logic low voltage conveyed thereon may result in the activation of transistor Q5, which in turn may pull local bit line LBL1 up toward source voltage VDD. Accordingly, a logic high voltage may be conveyed by local bit line LBL1 to the respective input of logic gate 217 (also a NAND gate in this embodiment).

Therefore in this example, one of transistors Q1 and Q3 may become active (while Q2 may remain inactive) according with the resulting state of local bit line LBL0. As previously noted and shown in the drawing of this particular embodiment, each cell unit 205 is coupled to its respective local bit line such that the logic value of its true node (i.e. CELL_H) may driven on the respective local bit line when the cell is selected. Accordingly, if a logic high voltage is stored on the true node of the selected one of cell units 205, the logic high voltage may be conveyed to local bit line LBL0. The logic high may be received by logic gate 213 and logic gate 217. Since both of these logic gates are NAND gates in this embodiment, their respective output will both be logic low voltages. Transistor Q1 (a PMOS transistor in this embodiment) may become active responsive to the logic low voltage received on its gate, while transistor Q3 (an NMOS transistor in this embodiment), may remain inactive. As a result, global bit line GBL0 may be pulled toward source voltage VDD through transistor Q1, thereby driving global bit line GBL0 to a logic high voltage. It is noted that the logic high voltage driven onto global bit line GBL0 in this embodiment may be equivalent to the logic state stored on the true node of the selected cell unit 205. Embodiments wherein cell units 205 are coupled to corresponding local bit lines in order to convey a logic values stored on their respective complementary nodes are also possible and contemplated.

In the embodiment shown, if the logic value stored on the true node of the selected one of cell units 205 is a logic low voltage, logic gate 213 and logic gate 217 may each receive inputs of one logic low voltage and one logic low voltage (i.e. GS0=High, LBL0=Low, LBL1=High). Accordingly, logic gate 213 and logic gate 217 may each output a logic high voltage. When logic gate 213 provides a logic high voltage output, transistor Q1 may be held inactive. However, transistor Q3 may become active responsive to a logic high output from logic gate 217. When active, transistor Q3 may pull down global bit line GBL0 toward a ground voltage. Accordingly, a logic low voltage may be conveyed on global bit line GBL0 in this configuration.

If a cell unit 205 coupled to local bit line LBL1 is selected (and thus no cell units 205 coupled to local bit line LBL0 are selected), a data bit may be driven onto global bit line GBL0 in accordance with the data stored in the selected cell unit 205. When no cell units coupled to local bit line GBL0 are selected, group select line GS0 may be de-asserted, which may in turn cause the activation of Q4 and the pulling of local bit line LBL0 up toward source voltage VDD. However, transistor Q5 may be inactive responsive to the assertion of group select line GS1, which may be asserted responsive to selection of one of the cell units 205 coupled to local bit line LBL1. Accordingly, group select line GS1 may provide a logic high voltage to a corresponding input of logic gate 215. Global bit line GBL0 may then be driven in accordance with the logic state conveyed from the selected one of cell units 205 onto local bit line LBL1. If a logic high voltage is conveyed onto local bit line LBL1 in this situation, transistor Q2 may become active and drive global bit line GBL0 high responsive to a logic low output resulting from two logic high inputs to logic gate 215. Otherwise, transistor Q3 may become active to drive global bit line GBL0 responsive to a logic high output from logic gate 217 resulting from the logic low input received via local bit line LBL1 and the logic high input received via local bit line LBL0.

Global bit line generation circuit 210 may be one of a number of like circuits coupled to a corresponding global bit line in a wired-OR configuration. Accordingly, each instance of global bit line generation circuit 210 may be configured to not drive the global bit line for some input signal combinations, in order to allow another instance of global bit line circuitry to drive the same global bit line. In the embodiment shown in FIG. 5, when no cell unit 205 coupled to either one of local bit lines LBL0 and LBL1 is selected, group select lines GS0 and GS1 may both be de-asserted. Responsive to the de-assertion of both group select lines, transistors Q4 and Q5 may both become active, thereby pulling their respective local bit lines up toward source voltage VDD. When local bit lines LBL0 and LBL1 are both pull to a logic high voltage, logic gate 217 may provide a logic low voltage output, which may in turn cause transistor Q3 to remain inactive. Furthermore, since both group select lines GS0 and GS1 are de-asserted (e.g., a logic low voltage in this embodiment), logic gates 213 and 215 may each receive one logic low voltage input and one logic high voltage input. Accordingly, logic gates 213 and 215 may in turn both provide logic high outputs to the gate terminals of transistors Q1 and Q2, respectively. Accordingly, transistors Q1 and Q2 may also remain inactive. Thus, when transistors Q1, Q2, and Q3 are all inactive at the same time, global bit line GBL0 may not be driven by that particular instance of global bit line generation circuit 210. Another instance of global bit line generation circuit 210 also coupled thereto may drive global bit line GBL0 if according to a selected on of its corresponding cell units 205.

The selection circuitry discussed above may be implemented without the need for precharge cycles to precharge the local bit lines. Since each cell unit 205 is coupled to a respective local bit line in such a manner that a bit cell may directly drive that local bit line, precharging may be unnecessary. Furthermore, the circuit arrangement discussed above may also eliminate the need for keeper circuits coupled to the local bit lines that may be used to hold the precharge voltage on a local bit line. Eliminating the need for precharge cycles may reduce both power consumption and circuit complexity, while the elimination of keepers may additionally reduce circuit complexity.

Figure 6:
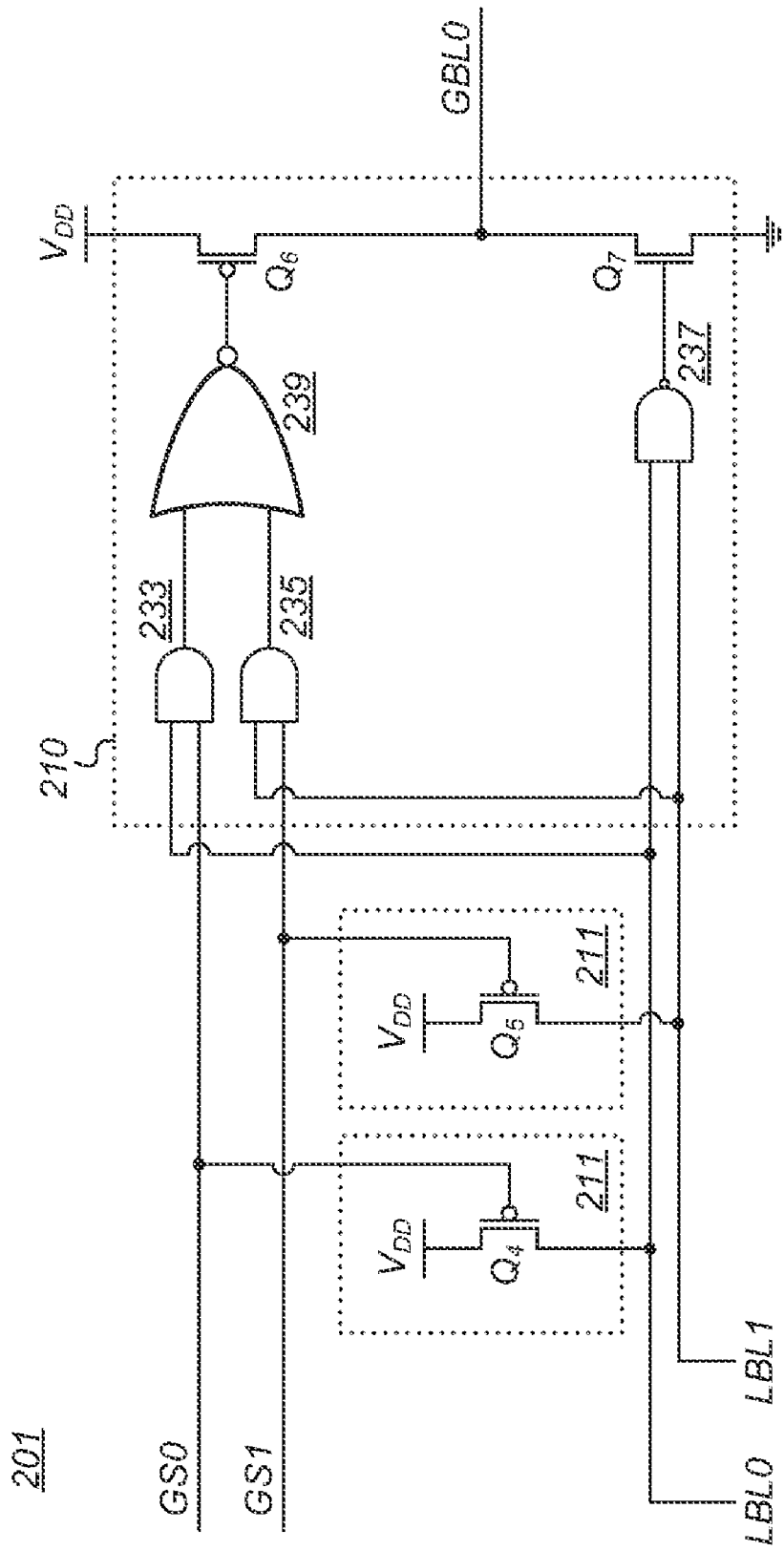
FIG. 6 is a schematic diagram of another embodiment of a global bit line generation circuit.

Turning now to FIG. 6, a schematic diagram of another embodiment of a global bit line generation circuit 210 is shown. In this particular embodiment, one of two transistors Q6 or Q7 may be used to drive global bit line GBL0, dependent on the local bit lines and the group select lines. Furthermore, it is possible in the embodiment shown that some signal combinations may result in neither of transistors Q6 or Q7 driving global bit line GBL0, since global bit line generation circuit 210 may be one of two or more of the same type circuits coupled to a global bit line in a wired-OR configuration.

In the embodiment shown, only one of group select lines GS0 and GS1 may be asserted at a given time (although both may be concurrently de-asserted). When group select line GS0 is asserted, the output of logic gate 233 (an AND gate in this embodiment) may be dependent on local bit line LBL0. If local bit line LBL0 is driven to a logic high voltage, then the output of logic gate 233 may be driven to a logic high voltage, which may in turn drive the output of logic gate 239 to a logic low voltage. A logic low voltage driven from logic gate 239 may in turn cause the activation of transistor Q6. As a result of the activation of transistor Q6, global bit line GBL0 may be pulled up toward source voltage VDD. Otherwise, if local bit line LBL0 is driven to a logic low voltage, the output of logic gate 237 (a NAND gate in this embodiment) may be driven high, resulting in the activation of transistor Q7. Accordingly, global bit line GBL0 may be pulled down toward a ground voltage responsive to the activation of transistor Q7.

If, in the embodiment shown, group select line GS1 is asserted, the output of logic gate 235 (an AND gate in this embodiment) depends upon a logic voltage level driven on local bit line LBL1. If local bit line LBL1 is driven to a logic high voltage, logic gate 235 may drive a logic high voltage on its output. As a result, logic gate 239 may drive a logic low on its output, which may in turn cause the activation of transistor Q6. As a result of the activation of transistor Q6, global bit line GBL0 may be pulled up toward source voltage VDD. If, on the other hand, local bit line LBL1 is driven to a logic low voltage, logic gate 237 may drive a logic high output, which may thus cause the activation of transistor Q7 and the subsequent pulling down toward a ground voltage of global bit line GBL0.

If neither of group select lines GS0 and GS1 are de-asserted (e.g., both are driven to logic low voltages in this embodiment), logic gates 233 and 235 may both drive logic low outputs. As a result, logic gate 239 may drive a logic high output, resulting in transistor Q6 becoming inactive. Furthermore, when both select lines GS0 and GS1 are de-asserted, local bit lines LBL0 and LBL1 may both be pulled up toward source voltage VDD through their corresponding pull-up circuits 211. Thus, with local bit lines LBL0 and LBL1 both driven high, the output of logic gate 237 may be driven low. With the output of logic gate 237 driven low, transistor Q7 may be held inactive. Thus, with group select lines GS0 and GS1 both de-asserted, both of transistors Q6 and Q7 may be held inactive, and thus global bit line GBL0 is not driven by global bit line generation circuit 210 in this case.

As with the embodiment discussed in reference to FIG. 5, the embodiment discussed in reference to FIG. 6 may be operable without the need for precharge cycles and without the need for keeper circuits coupled to the local bit lines. Accordingly, may derive some of the same advantageous characteristics.

While the embodiment described in reference FIG. 6 has been discussed with reference to specific logic gates, specific logic voltage levels, and specific assertion levels, the scope of this embodiment is not so limited. Accordingly, other embodiments in which different types of logic gates and/or different logic gate arrangements, different logic voltage levels, and different assertion levels are possible and contemplated.

Figure 7:
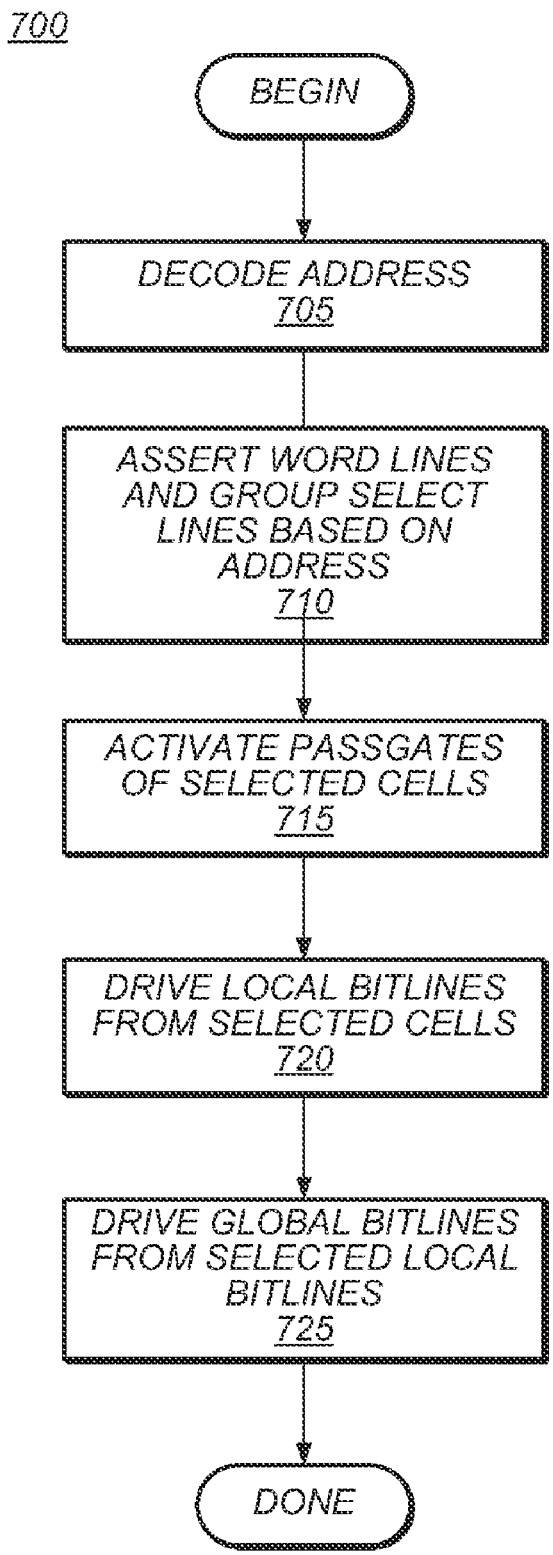
FIG. 7 is a flow diagram of one embodiment of a method for selecting data from a cell in a register file.

Turning now to FIG. 7, a flow diagram of one embodiment of a method for selecting data from a cell in a register file. Embodiments of method 700 may be performed in conjunction with various embodiments of any of the circuits discussed above. Furthermore, while FIG. 7 is described in conjunction with a register file, it is noted that embodiments of the method illustrated therein may also be used with other memory types (e.g., cache memory) that may be suitable for use with various embodiments of the circuitry discussed above.

Method 700 begins in the embodiment shown with the decoding of an address. The address may be received and decoded by an address decoder associated with the register file from which data is to be read (block 705). Upon decoding the address, an address decoder may cause the assertion of various signal lines, including the assertion of one or more word lines and one or more group select lines associated with the address (block 710).

Responsive to asserting word lines coupled to the selected cells, passgates (or other types of bit line generation circuitry) may be activated (block 715). Responsive to activation of the passgates, the local bit lines coupled thereto may be driven by the selected cells (block 720). In addition, while the word line signals are driven to the selected cells, the asserted group select line signals may be driven to selected ones of the global bit line generation circuits that are associated with the selected cells.

Responsive to receiving the group select signals, the selected global bit line generation circuits may drive respective global bit lines based on the state of the local bit lines associated with the selected cells (725). However, for those subsets of cells that are not selected (and thus do not receive asserted word line signals), the respective local bit lines may be driven to a predetermined state such that they do not affect the signals that are eventually driven onto the global bit lines.

Figure 8:
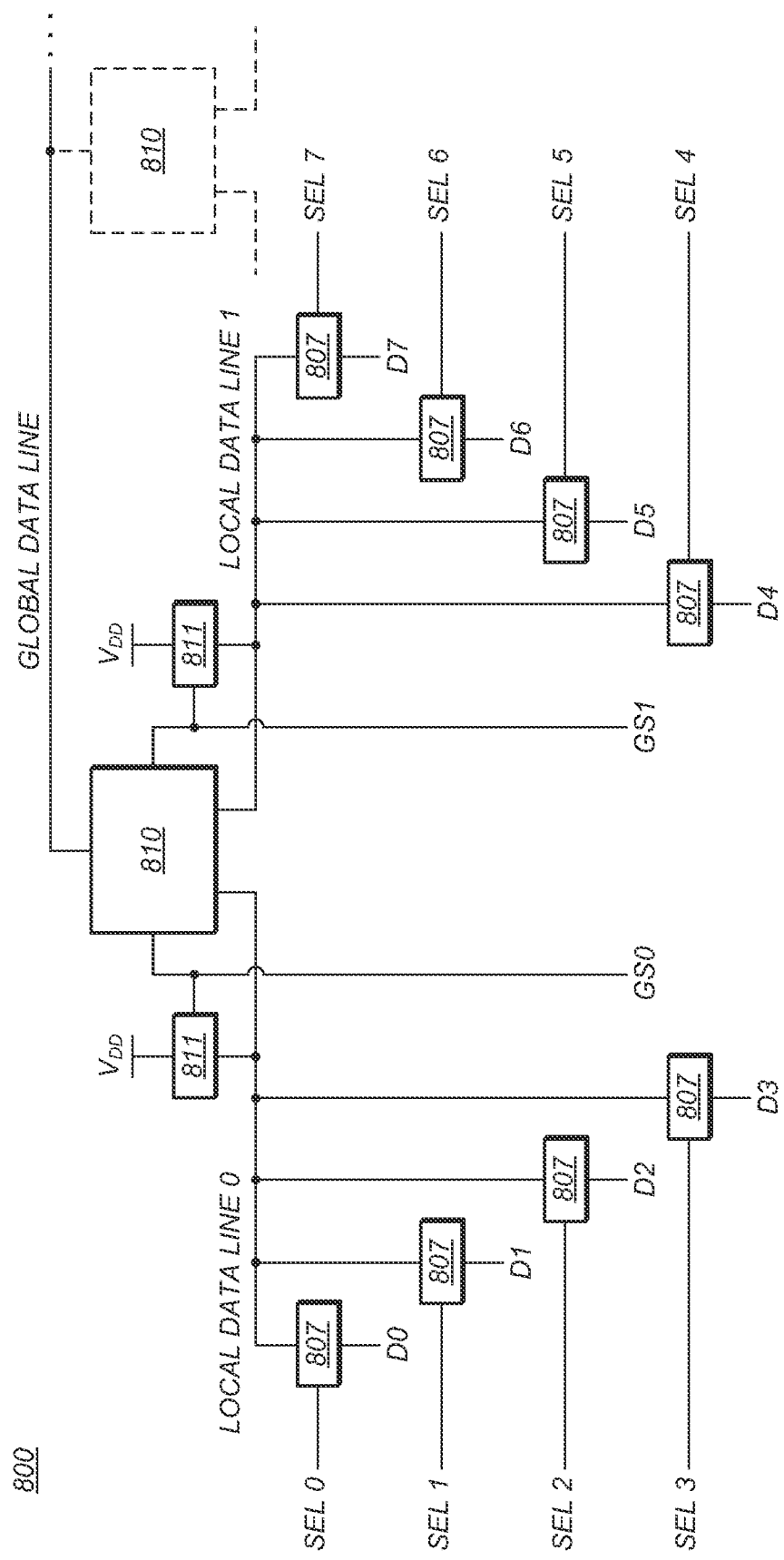
FIG. 8 is a block diagram of one embodiment of a multiplexer.

FIG. 8 is a block diagram of one embodiment of a multiplexer. In the embodiment shown, multiplexer 800 is based on an arrangement similar to that of selection circuit 201 as discussed above. Multiplexer 800 in the embodiment shown includes a global data line generation circuit 810 coupled to receive two local data lines (local data line 0 and local data line 1). In this embodiment, each of the local data lines is coupled to a group of passgates 807, local data line 0 being coupled to a first set of passgates and local data line 1 being coupled to a second set of passgates. Each of the passgates 807 may also be coupled to receive a corresponding one of data inputs D0-D7. The exact number of data inputs, as well as the number of passgates coupled to a particular one of the local data lines, may vary among different embodiments. A corresponding one of select lines SEL 0-SEL 7 may also be provided to each of the passgates. When a given one of the select lines is asserted, its corresponding pass-gate 807 may become active, thereby allowing a signal on the data input to propagate through to the respective local data line.

In the embodiment shown, global data line generation circuit 810 is also coupled to receive group select lines GS0 and GS1, which correspond to local data line 0 and local data line 1, respectively. The group select lines GS0 and GS1 may also be provide to corresponding pull-up circuits 811. Each of the pull-up circuits 811 may pull their corresponding local data lines up toward source voltage VDD when their corresponding group select lines are de-asserted. Although not explicitly shown, multiplexer 800 may include additional circuitry to cause the assertion of a group select line when one of passgates of that group is selected. For example, select lines SEL 0-SEL 3 may be logically OR'ed together to generate group select signal GS0, while select signals SEL 4-SEL 7 could be logically OR'ed together to generate group select signal GS1.

Similar to embodiments of the selection circuitry discussed above, multiplexer 800 may be a one-hot structure, wherein only a single passgate is selected to allow data from a data input to be conveyed to the global data line. Furthermore, global data line generation circuitry 810 may be implemented using the embodiments discussed above in reference to FIGS. 5 and 6, as well as any suitable variation thereof.

Using variations of the arrangement shown in FIG. 8, multiplexers of varying width may be constructed. For example, multiplexer 800 shown in FIG. 8 may include a second global data line circuit 810 coupled to the global data line. If each of two global data line generation circuits are coupled to select one of eight possible inputs, then such an embodiment of multiplexer 800 overall may be configured to select one of sixteen possible inputs. In general, each local data line may have as few as a single passgate 807 coupled thereto (and thus a single data input), or may have any greater number that the design will allow. Similarly, a global data line may have as few as a single global data line generation circuit 810 coupled thereto, and may also include a greater number. Accordingly, various embodiments of multiplexer 800 may be implemented, wherein the basic design may be a scalable design that is suitable for both large and small applications.

Figure 9:
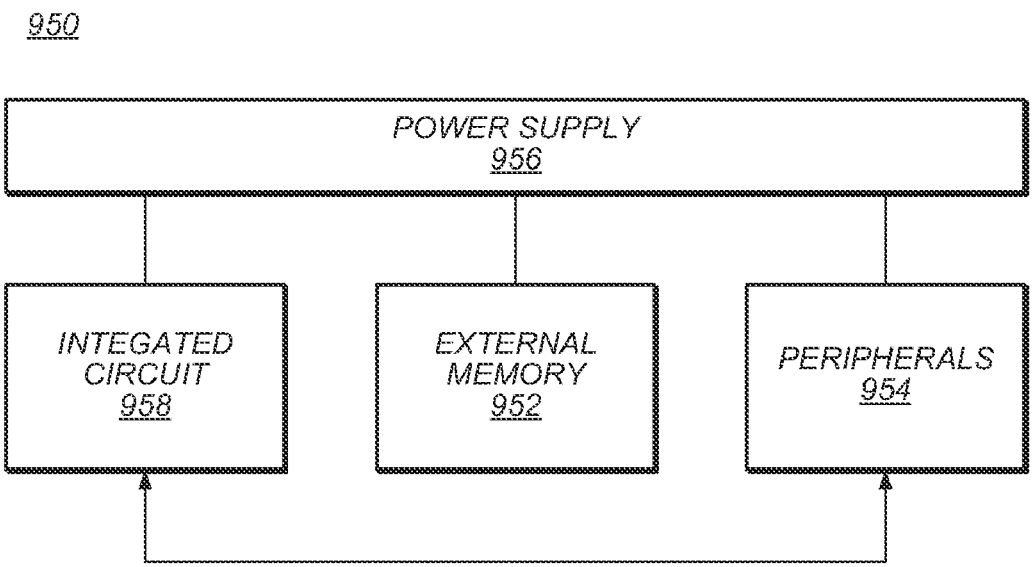
FIG. 9 is a block diagram of one embodiment of a computer system.

Turning next to FIG. 9, a block diagram of one embodiment of a system 950 is shown. In the illustrated embodiment, the system 950 includes at least one instance of an integrated circuit 958 coupled to one or more peripherals 954 and an external memory 952. A power supply 956 is also provided which supplies the supply voltages to the integrated circuit 958 as well as one or more supply voltages to the memory 952 and/or the peripherals 954. In some embodiments, more than one instance of the integrated circuit 958 may be included. The integrated circuit 958 may include one or more processors such as processor 10 (as discussed above).

The external memory 952 may be any desired memory. For example, the memory may include dynamic random access memory (DRAM), static RAM (SRAM), flash memory, or combinations thereof. The DRAM may include synchronous DRAM (SDRAM), double data rate (DDR) SDRAM, DDR2 SDRAM, DDR3 SDRAM, etc.

The peripherals 954 may include any desired circuitry, depending on the type of system 150. For example, in one embodiment, the system 950 may be a mobile device and the peripherals 954 may include devices for various types of wireless communication, such as wifi, Bluetooth, cellular, global position system, etc. The peripherals 954 may also include additional storage, including RAM storage, solid state storage, or disk storage. The peripherals 154 may include user interface devices such as a display screen, including touch display screens or multitouch display screens, keyboard or other keys, microphones, speakers, etc.

Numerous variations and modifications will become apparent to those skilled in the art once the above disclosure is fully appreciated. It is intended that the following claims be interpreted to embrace all such variations and modifications.

What is claimed is:

1. A register file comprising:
  a plurality of cells each configured to store a bit, wherein the plurality of cells are divided into a plurality of non-overlapping sets of two or more cells;
  a plurality of local bit lines including a first local bit line, wherein each of the plurality of non-overlapping sets of cells are associated with respective local bit lines of the plurality of local bit lines including a first set of cells associated with the first local bit line;
  bit line generation circuitry coupled to the first local bit line and to the first set of cells, wherein the bit line generation circuitry is configured to drive the first local bit line responsive to a selected cell for a read of the register file being one of the first set;
  a first pull-up circuit coupled between the first local bit line and a source voltage line, wherein a gate terminal of the first pull-up circuit is coupled to receive a first group select signal that corresponds to the first local bit line and indicates whether or not the selected cell is in the first set, wherein the first pull-up circuit is configured to pull up the first local bit line toward a source voltage present on the source voltage line during the read of the register file responsive to the first group select signal being de-asserted, indicating that the selected cell is not in the first set; and
  global bit line generation circuitry coupled to a global bit line and further coupled to receive the first group select signal and the first local bit line, wherein the global bit line generation circuitry is configured to selectively drive a global bit line responsive to the first group select signal and the first local bit line.

2. The register file as recited in claim 1, wherein the global bit line generation circuitry is further coupled to receive a second group select signal and a second local bit line, wherein the global bit line generation circuitry is configured to selectively drive the global bit line responsive to the second group select line and the second local bit line.

3. The register file as recited in claim 2, wherein the bit line generation circuitry is further coupled to the second local bit line and a second set of cells, wherein the local bit line generation circuitry is configured to drive the second local bit line responsive to a selected cell for a read of the register file being one of a second set, wherein the register file further includes a second pull-up circuit coupled between the second local bit line and the source voltage line and having a respective gate terminal coupled to receive the second group select line, wherein the second pull-up circuit is configured to pull up the second local bit line to the source voltage during the read of the register file responsive to the second group select signal being de-asserted, indicating that the selected cell is not in the second set.

4. The register file as recited in claim 1, wherein the global bit line generation circuitry includes:
  a first logic gate coupled to receive the first group select line and the first local bit line,
  a first transistor having a gate terminal coupled to an output of the first logic gate, wherein the first transistor is coupled between a source voltage and the global bit line, and wherein the first transistor is configured to, when activated, pull the global bit line up toward the source voltage;

a second logic gate coupled to receive a second group select signal and a second local bit line;

a second transistor having a gate terminal coupled to an output of the second logic gate, wherein the second transistor is coupled between the source voltage and the global bit line, and wherein the second transistor is configured to, when activated, pull the global bit line toward the source voltage;

a third logic gate coupled to receive the first local bit line and the second local bit line; and a third transistor having a gate terminal coupled to an output of the third transistor, wherein the third transistor is coupled between a ground voltage and the global bit line, and wherein the third transistor is configured to, when activated, pull the global bit line toward the ground voltage.

5. The register file as recited in claim 1, wherein the global bit line generation circuitry includes:

a first logic gate coupled to receive the first local bit line and the first group select line;

a second logic gate coupled to receive a second local bit line and a second group select line;

a third logic gate coupled to receive an output from the first logic gate and an output from the second logic gate;

a first transistor having a gate terminal coupled to receive an output from the third logic gate, wherein the first transistor is coupled between a source voltage and the global bit line, and wherein the first transistor is configured to, when activated, pull the global bit line toward the source voltage;

a fourth logic gate coupled to receive the first local bit line and the second local bit line; and a second transistor having a gate terminal coupled to receive an output from the fourth logic gate, wherein the second transistor is coupled between a ground voltage and the global bit line, and wherein the second transistor is configured to, when activated, pull the global bit line toward the ground voltage.

6. A register file comprising:

a plurality of cells each configured to store a bit, wherein each of the plurality of cells is coupled to receive a respective word line, and wherein the plurality of cells is divided into a plurality of groups each associated with a respective group select line;

a decoder configured to decode an address and further configured to generate word lines and a group select line corresponding to the decoded address, wherein the decoder is configured to assert a group select line responsive to the assertion of any word line corresponding to a particular one of the plurality of groups;

a first local bit line and a second local bit line, wherein each of the first and second local bit lines is coupled to two or more of the plurality of cells, wherein the first and second local bit lines are associated with first and second group select lines, respectively, and wherein a given one of the plurality of cells is configured to drive its respective local bit line responsive to the assertion of its respective word line and respective group select line;

global bit line generation circuitry coupled to the global bit line and coupled to receive the first and second local bit lines and the first and second group select lines, wherein the global bit line generation circuitry is configured to selectively drive the global bit line dependent upon respective states of the first and second local bit lines and the first and second group select lines;

first and second pull-up circuits coupled to the first and second local bit lines, respectively, wherein each of the first and second pull-up circuits is further coupled to a source voltage line at a source voltage, wherein each of the first and second pull-up circuits is configured to pull-up its respective bit line toward the source voltage during a read of the register file responsive to its respective group select line being de-asserted.

7. The register file as recited in claim 6, wherein the global bit line generation circuitry includes:

a first transistor coupled to the global bit line, wherein the first transistor is configured to drive the global bit line, based on the first local bit line and the first group select line, by pulling the global bit line toward the source voltage;

a second transistor coupled to the global bit line, wherein the second transistor is configured to drive the global bit line, based on the second local bit line and the second group select line, by pulling the global bit line toward the source voltage; and a third transistor, wherein the third transistor is configured to drive the global bit line, based on the first and second local bit lines and the first and second group select lines, by pulling the global bit line toward a ground voltage;

wherein at most, only one of the first, second, or third transistors is active at any given time.

8. The register file as recited in claim 7, wherein the global bit line generation circuitry further includes:

a first NAND gate coupled to receive the first local bit line and the first group select line, wherein an output of the first NAND gate is coupled to a gate terminal of the first transistor;

a second NAND gate coupled to receive the second local bit line and the second group select line, wherein an output of the second NAND gate is coupled to a gate terminal of the second transistor;

a third NAND gate coupled to receive the first bit line and the second bit line, wherein an output of the third NAND gate is coupled to an gate terminal of the third transistor.

9. The register file as recited in claim 6, wherein the global bit line generation circuitry includes:

a first transistor coupled between a source voltage and the global bit line, wherein the first transistor is configured to, when active, pull the global bit line toward the source voltage;

a second transistor coupled between a ground voltage and the global bit line, wherein the second transistor is configured to, when active, pull the global bit line toward the ground voltage;

a first logic gate coupled to receive the first local bit line and the first group select line;

a second logic gate coupled to receive the second local bit line and the second group select line;

a third logic gate coupled to receive an output from the first logic gate and an output from the second logic gate, wherein an output from the third logic gate is coupled to a gate terminal of the first transistor; and a fourth logic gate coupled to receive the first local bit line and the second local bit line, wherein an output from the fourth logic gate is coupled to a gate terminal of the second transistor;

wherein, at most, only one of the first or second transistors is active at any given time.

10. The register file as recited in claim 6 further comprising a plurality of passgates, wherein each of the passgates is coupled between a respective one of the plurality of cells and a respective one of the first and second local bit lines, and wherein each of the plurality of passgates is coupled to receive a respective word line, and, wherein, when active, each of the plurality of passgates is transparent to its respective one of the plurality of cells.

11. A multiplexer comprising:
   a plurality of passgates each configured to convey a bit of data when activated, wherein the plurality of passgates is divided into a plurality of non overlapping sets of two or more passgates;
   a plurality of local data lines including a first local data line, wherein each of the plurality of non-overlapping sets of passgates are associated with respective local data lines of the plurality of local data lines including a first set of passgates associated with the first local data line;
   a plurality of data inputs including a first set of data inputs each coupled to corresponding ones of the first set of passgates, wherein a selected one of the first set of passgates is configured to couple its corresponding data input to the first local data line responsive to receiving a first data selection signal;
   a first pull-up circuit coupled between the first local data line and a source voltage line at a source voltage potential, wherein the first pull-up circuit includes a respective gate terminal coupled to receive a first group select signal that corresponds to the first local data line and indicates whether or not the selected passgate is in the first set, wherein the first pull-up circuit is configured to pull up the first local data line toward the source voltage potential during a selection of one of the data inputs responsive to the first group select signal being de-asserted, indicating that the selected passgate is not in the first set; and
   global data line generation circuitry coupled to a global data line and further coupled to receive the first group select signal and the first local data line, wherein the global data line generation circuitry is configured to selectively drive a global data line responsive to the first group select signal and the first local data line.

12. The multiplexer as recited in claim 11, wherein the global data line generation circuitry is further coupled to receive a second group select signal and a second local data line, wherein the global data line generation circuitry is configured to selectively drive the global data line responsive to the second group select line and the second local data line.

13. The multiplexer as recited in claim 12, further comprising a second set of passgates coupled to the second local data line and a second set of data inputs each coupled to corresponding ones of the second set of passgates, wherein a selected one of the second set of passgates is configured to couple its corresponding data input to the second local data line responsive to receiving a second data selection signal, wherein the multiplexer further includes a second pull-up circuit coupled between the second local data line and the source voltage line, wherein the second pull-up circuit includes a respective gate terminal coupled to receive the second group select line, wherein the second pull-up circuit is configured to pull up the second local data line toward the source voltage potential responsive to the second group select signal being de-asserted, indicating that the selected data is not associated with the second set.

14. The multiplexer as recited in claim 11 wherein the global data line generation circuitry includes:
   a first logic gate coupled to receive the first group select line and the first local data line,
   a first transistor having a gate terminal coupled to an output of the first logic gate, wherein the first transistor is coupled between the source voltage potential and the global data line, and wherein the first transistor is configured to, when activated, pull the global data line up toward the source voltage potential;
   a second logic gate coupled to receive a second group select signal and a second local data line;
   a second transistor having a gate terminal coupled to an output of the second logic gate, wherein the second transistor is coupled between the source voltage potential and the global data line, and wherein the second transistor is configured to, when activated, pull the global data line toward the source voltage potential;
   a third logic gate coupled to receive the first local data line and the second local data line; and
   a third transistor having a gate terminal coupled to an output of the third transistor, wherein the third transistor is coupled between a ground voltage and the global data line, and wherein the third transistor is configured to, when activated, pull the global data line toward the ground voltage.

15. The multiplexer as recited in claim 11, wherein the global data line generation circuitry includes:
   a first logic gate coupled to receive the first local data line and the first group select line;
   a second logic gate coupled to receive a second local data line and a second group select line;
   a third logic gate coupled to receive an output from the first logic gate and an output from the second logic gate;
   a first transistor having a gate terminal coupled to receive an output from the third logic gate, wherein the first transistor is coupled between a source voltage and the global data line, and wherein the first transistor is configured to, when activated, pull the global data line toward the source voltage;
   a fourth logic gate coupled to receive the first local data line and the second local data line; and
   a second transistor having a gate terminal coupled to receive an output from the fourth logic gate, wherein the second transistor is coupled between a ground voltage and the global data line, and wherein the second transistor is configured to, when activated, pull the global data line toward the ground voltage.

16. A method comprising:
   decoding the address provided to a register file, the address indicative of a register location to be read;
   based on the decoded address, asserting a word line signal and a group select signal corresponding to one of a plurality of group select lines, wherein each group select line corresponds to one of a plurality of non-overlapping subsets of cells each having two or more of a plurality of cells, wherein each of the non-overlapping subsets are associated with a respective one of a of a plurality of local bit lines, wherein the non-overlapping subsets include a first subset associated with a first local bit line;
   providing one of the one or more word line signals to a selected cell associated with the first local bit line of the plurality of local bit lines;
   providing the group select signal to global bit line generation circuitry coupled to a global bit line and the first local bit line;
   driving the first local bit line based on data stored in the selected cell;
   for each subset that does not include a selected cell, driving its respective local bit line to a pre-determined state responsive to its group select signal being de-asserted during a read of the register file, wherein said driving the respective local bit line for each non-selected cell is performed by activating a respective pull transistor coupled between its respective local bit line and a fixed voltage node.

17. The method as recited in claim 16, further comprising driving the global bit line based on the data driven from the selected cell to the first local bit line.

18. The method as recited in claim 17, further comprising:
activating a pull-up transistor coupled to the global bit line if the data stored in the selected cell is of a first logic value, wherein the global bit line is pulled toward a source voltage responsive to activating the pull-up transistor; and
activating a pull-down transistor coupled to the global bit line if the data stored in the select cells is of a second logic value, wherein the global bit line is pulled toward a ground voltage responsive to activating the pull-down transistor.

19. The method as recited in claim 16 further comprising de-asserting the one of the one or more word line signals and the group select signal subsequent to driving the global bit line based on the data driven from the selected cell to the first local bit line, wherein de-asserting the group select signal causes the first local bit line to be driven to the predetermined state.

20. The method as recited in claim 16 further comprising activating a passgate coupled of the selected cell responsive to providing the one of the one or more word line signals to the selected cell, wherein the passgate is coupled to the first local bit line.

21. A processor comprising:
an execution core; and
a register file coupled to provide data the execution core, wherein the register file includes a plurality of static selection circuits each coupled to a respective one of a plurality of global bit lines, wherein each of the plurality of static selection circuits includes:
a first local bit line and a second local bit line respectively coupled to a first plurality of storage cells and a second plurality of storage cells, wherein each storage cell of the first plurality and the second plurality is configured to drive its corresponding one of the first and second local bit lines responsive to assertion of a corresponding word line;
a first plurality of bit line generation circuits, wherein each of the first plurality of bit line generation circuits is coupled between the first bit line and a respective one of the first plurality of storage cells;
a second plurality of bit line generation circuits, wherein each of the second plurality of bit line generation circuits is coupled between the second bit line and a respective one of the second plurality of storage cells;
a first pull-up circuit coupled between the first local bit line and a source voltage line having a source voltage present thereon, the first pull-up circuit having a first gate terminal coupled to a first group select line, and a second pull-up circuit coupled between the second local bit line and the source voltage line, the second pull-up circuit having a second gate terminal coupled to a second group select line, wherein each of the first and second pull-up circuits is configured to pull up its respective local bit line toward the source voltage during a read of the register file when its respective group select line is de-asserted; and
a global bit line generation circuit coupled to receive each of the first and second local bit lines and each of the first and second group select lines, wherein the global bit line generation circuit is configured to drive a respective one of the plurality of global bit lines in accordance with a state stored in one of the first or second plurality of cells when the corresponding word line is asserted for the one of the first or second plurality of cells and the respective one of the first or second group select lines is also asserted.

22. The processor as recited in claim 21, wherein the global bit line generation circuit of each of the plurality of selection circuits includes:
a first global bit line pull up-circuit configured to pull the respective one of the plurality of global bit lines toward a source voltage responsive to assertion of the first group select signal and a logic high voltage present on the first local bit line;
a second global bit line pull-up circuit configured to pull the respective one of the plurality of global bit lines toward a source voltage responsive to assertion of the second group select signal and a logic high voltage present on the second local bit line;
a global bit line pull-down circuit configured to pull the respective one of the plurality of global bit lines toward a ground voltage responsive to a logic low voltage present on one of the first or second local bit lines.

23. The processor as recited in claim 21, wherein the global bit line generation circuit of each of the plurality of selection circuits includes:
a global bit line pull-up circuit configured to pull the respective one of the plurality of global bit lines toward a source voltage responsive to one of the first or second group select lines being asserted and the respective one of the first or second local bit lines being at a logic high voltage; and
a global bit line pull-down circuit configured to pull the respective one of the plurality of global bit lines toward a ground voltage responsive to a logic low voltage present on one of the first or second local bit lines.

24. The processor as recited in claim 21, wherein each of the first and second plurality of storage cells is coupled to its respective one of the first and second local bit lines via a respective one of a first plurality of passgates and a second plurality of passgates, wherein each of the first and second plurality of passgates is configured to receive the corresponding word line for that particular one of the first and second plurality of storage cells.

25. The processor as recited in claim 21, wherein the register file includes a decoder configured to assert the first group select signal when any one of the first plurality of cells is selected and further configured to assert the second group select signal when any one of the second plurality of cells is selected.

* * * * *